United States Patent
McGrath et al.

(10) Patent No.: US 7,361,877 B2
(45) Date of Patent: Apr. 22, 2008

(54) PINNED-PHOTODIODE PIXEL WITH GLOBAL SHUTTER

(75) Inventors: R. Daniel McGrath, Pittsford, NY (US); R. Michael Guidash, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 27 days.

(21) Appl. No.: 11/393,292

(22) Filed: Mar. 30, 2006

(65) Prior Publication Data

US 2006/0266922 A1   Nov. 30, 2006

Related U.S. Application Data

(60) Provisional application No. 60/685,173, filed on May 27, 2005.

(51) Int. Cl.
*H01L 27/00* (2006.01)
(52) U.S. Cl. .............................. 250/208.1; 250/214.1; 348/296; 348/310
(58) Field of Classification Search ............... 348/296, 348/310; 250/208.1, 214.1
See application file for complete search history.

(56) References Cited

U.S. PATENT DOCUMENTS

| | | | |
|---|---|---|---|
| 4,980,735 A * | 12/1990 | Yamawaki | 257/222 |
| 5,867,215 A * | 2/1999 | Kaplan | 348/315 |
| 5,986,297 A * | 11/1999 | Guidash et al. | 257/223 |
| 6,087,686 A * | 7/2000 | Fox et al. | 257/233 |
| 6,566,697 B1 | 5/2003 | Fox et al. | |
| 6,677,656 B2 * | 1/2004 | François | 257/462 |
| 7,115,923 B2 * | 10/2006 | Hong | 257/290 |
| 2004/0135070 A1 * | 7/2004 | Cazaux et al. | 250/214.1 |
| 2005/0001248 A1 | 1/2005 | Rhodes | |
| 2005/0110093 A1 * | 5/2005 | Altice et al. | 257/359 |
| 2006/0044243 A1 * | 3/2006 | Rysinski | 345/92 |

FOREIGN PATENT DOCUMENTS

| | | |
|---|---|---|
| EP | 0 738 010 A2 | 10/1996 |
| EP | 0 898 312 A2 | 2/1999 |
| EP | 1 119 188 A2 | 7/2001 |

\* cited by examiner

*Primary Examiner*—Georgia Epps
*Assistant Examiner*—Seung C Sohn
(74) *Attorney, Agent, or Firm*—Peyton C. Watkins

(57) ABSTRACT

An image sensor includes a two-dimensional array of pixels having a photodetector for collecting charge in response to incident light; a storage region adjacent the photodetector that receives the charge from the photodetector; a sense node adjacent the storage region that receives the charge from the storage region and converts the charge to a voltage signal; and an input to an amplifier for sensing the voltage signal from the sense node.

20 Claims, 5 Drawing Sheets

PINNED-PHOTODIODE PIXEL WITH GLOBAL SHUTTER

CROSS REFERENCE TO RELATED APPLICATIONS

This is a 111A application of Provisional Application Ser. No. 60/685,173, filed May 27, 2005.

FIELD OF THE INVENTION

The invention relates generally to the field of image sensors, and in particular to image sensors having global electronic shuttering.

BACKGROUND OF THE INVENTION

Referring to FIG. 1, currently known and utilized image sensors use a pixel 10 which is a pinned-photodiode-pixel CMOS image sensor. It incorporates a photodiode 20 read-out through a transfer gate 30 onto a sense node 40 which can be reset to a reference voltage and which is connected to a readout, for example, the gate of a source follower circuit 50. In addition, the photodiode 20 is connected to an overflow gate 60 to carry off photocurrent generated during the time outside of the shutter window.

The photodiode 20 is made as a pinned photodiode with a shallow 20 p-type pinning layer 70 and a deeper n-type diffusion 80 to create a buried channel with controlled potential, for example 1.5 V, for holding charge. This combination of dopings produces a very low dark current and density of dark current point defects. An overflow drain 90 and a reference bias connected to the reset gate are set to a higher voltage, for example 3.3 V.

Referring to FIGS. 1 and 2, operation involves using either the overflow drain 90 or the transfer gate 30 and the reset gate 100 combination to empty the photodiode 20. The reset gate I 00 also is used to reset the sense node 40 to a set bias greater than that of the photodiode 20. The overflow drain 90, the transfer gate 30, and the overflow gate 60 are then turned off on all pixels simultaneously to begin the shutter window and the signal from the incident light is integrated on the photodiode 20. To end the shutter window, the transfer gate 30 is turned on and the signal charge is completely transferred to the sense node 40. The overflow drain 90 is turned on so that any additional charge generated on the photodiode 20 will be drained away. The output is then readout; the reset gate 100 is used to set the sense node 40 back to the reference voltage, and the output is readout again. The signal is the difference between the two readouts.

The prior art has several limitations as follows: (1) the reference readout must be done after the signal readout so that they are from uncorrelated reset operations and temporal noise is added; (2) the signal charge must be held on the sense node from the end of the shutter window until its readout, allowing for the buildup of dark current as background and as bright points during this time.

Consequently, a need exists for overcoming the above-described drawbacks.

SUMMARY OF THE INVENTION

The present invention is directed to overcoming one or more of the problems set forth above. Briefly summarized, according to one aspect of the present invention, the invention resides in an image sensor comprising a photodetector for collecting charge in response to incident light; a storage region adjacent the photodetector that receives the charge from the photodetector; a sense node adjacent the storage region that receives the charge from the storage region and converts the charge to a voltage signal; and an amplifier for sensing the voltage signal from the sense node.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the following advantages of providing global electronic shutter with low dark current storage region and true correlated double sampling for reduced noise.

DETAILED DESCRIPTION OF THE INVENTION

Figure 3:
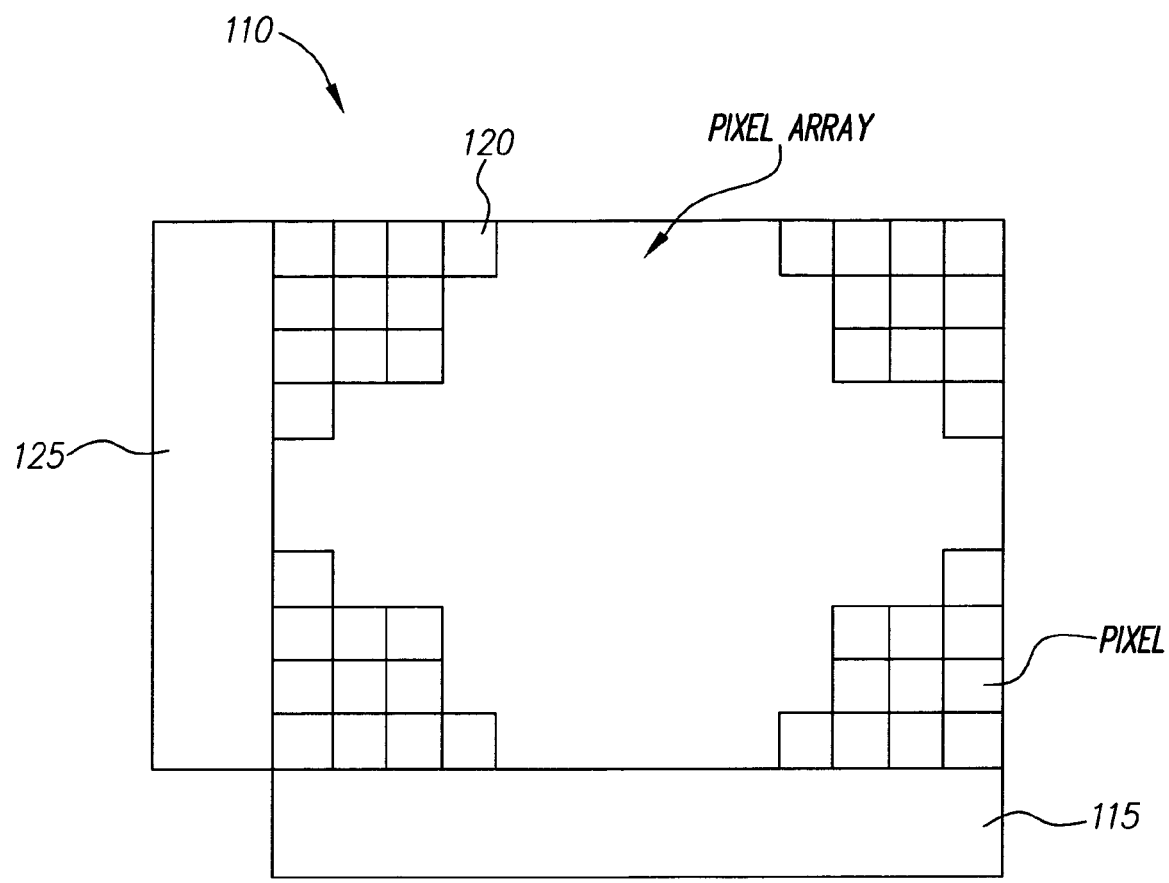
FIG. 3 is a top view of an image sensor of the present invention.

Referring to FIG. 3, there is shown the image sensor 110 of the present invention that is arranged in a two-dimensional array of pixels 120. The image sensor 110 also includes readout circuitry 115 for reading out the signals from the pixels 120 and address circuitry 125 for providing timing signals to the pixels 120.

Figure 4:
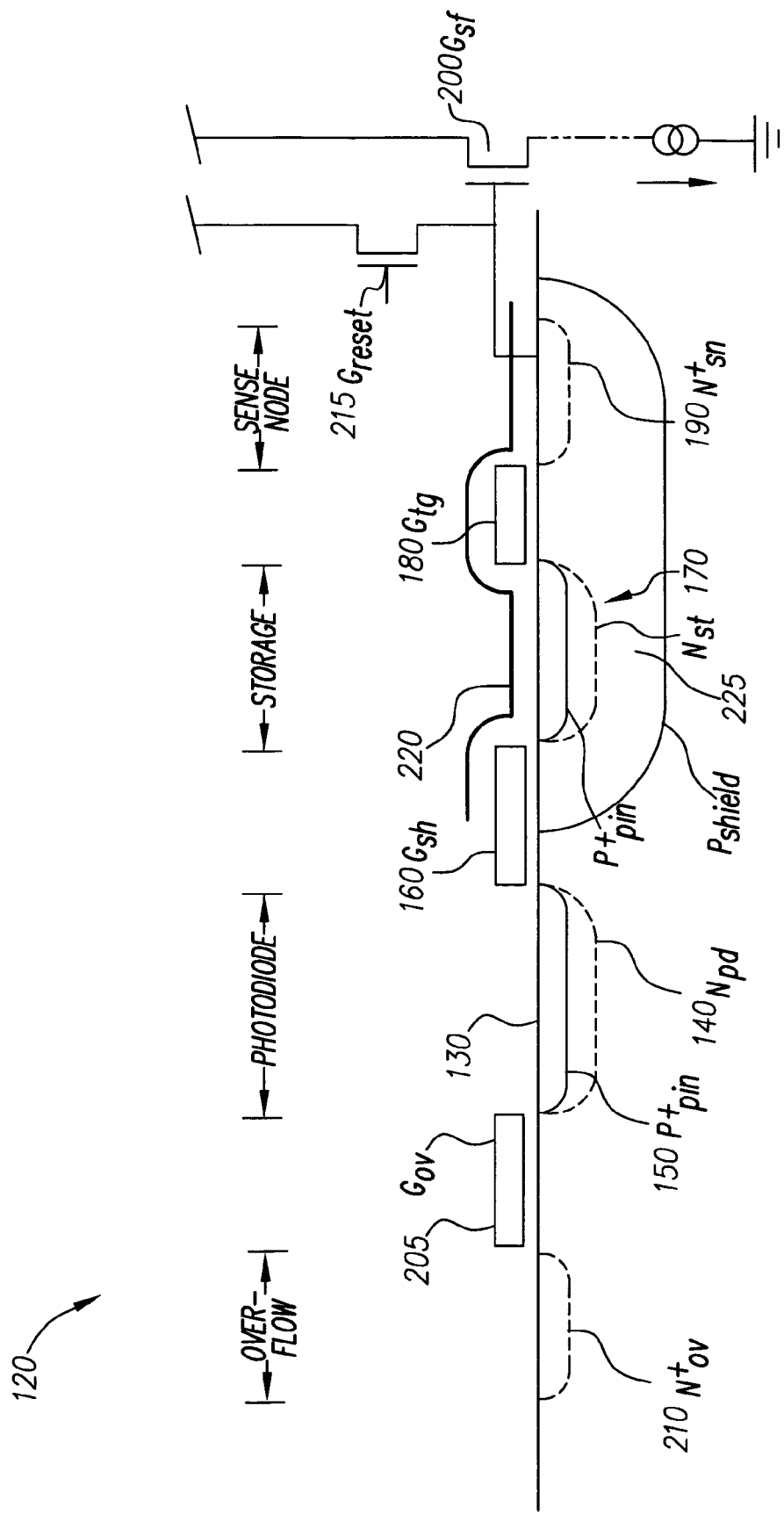
FIG. 4 is a side view in cross section of the image sensor of the present invention.

Referring to FIG. 4, there is shown a cross-section of the image sensor of the present invention. The image sensor includes a plurality of pixels 120, only one of which is shown for clarity, each pixel 120 having a first pinned photodiode 130 having a layer 140 for collecting charge generated from incident light and having a pinning layer 150. A shutter gate 160 transfers the charge to a second pinned diode or storage region 170 for storing the transferred charge. A transfer gate 180 transfers the charge to a sense node 190, preferably a floating diffusion, which is adjacent the second pinned diode 170. The sense node 190 converts the charge to a voltage which is sensed by an amplifier 200, preferably a source follower. A doped region or charge shield 225 surrounds the storage region 170 and sense node 190 for substantially shielding the storage region 170 and sense node 190 from photo-generated charge not transferred from the photodetector 130. A reset transistor 215 resets the floating diffusion 190 to a reference voltage. An overflow drain 210 is adjacent the first pinned photodiode 130 for draining excess charge from the first pinned photodiode 130.

The second pinned diode 170 and the floating diffusion 190 are spanned and covered by a lightshield 220 for preventing incident light to be received by the second pinned diode 170 and the floating diffusion 190. The lightshield 220 is preferably substantially 50 to 500 nanometers from a top surface of a semiconductor in the sense node 190.

Figure 1:
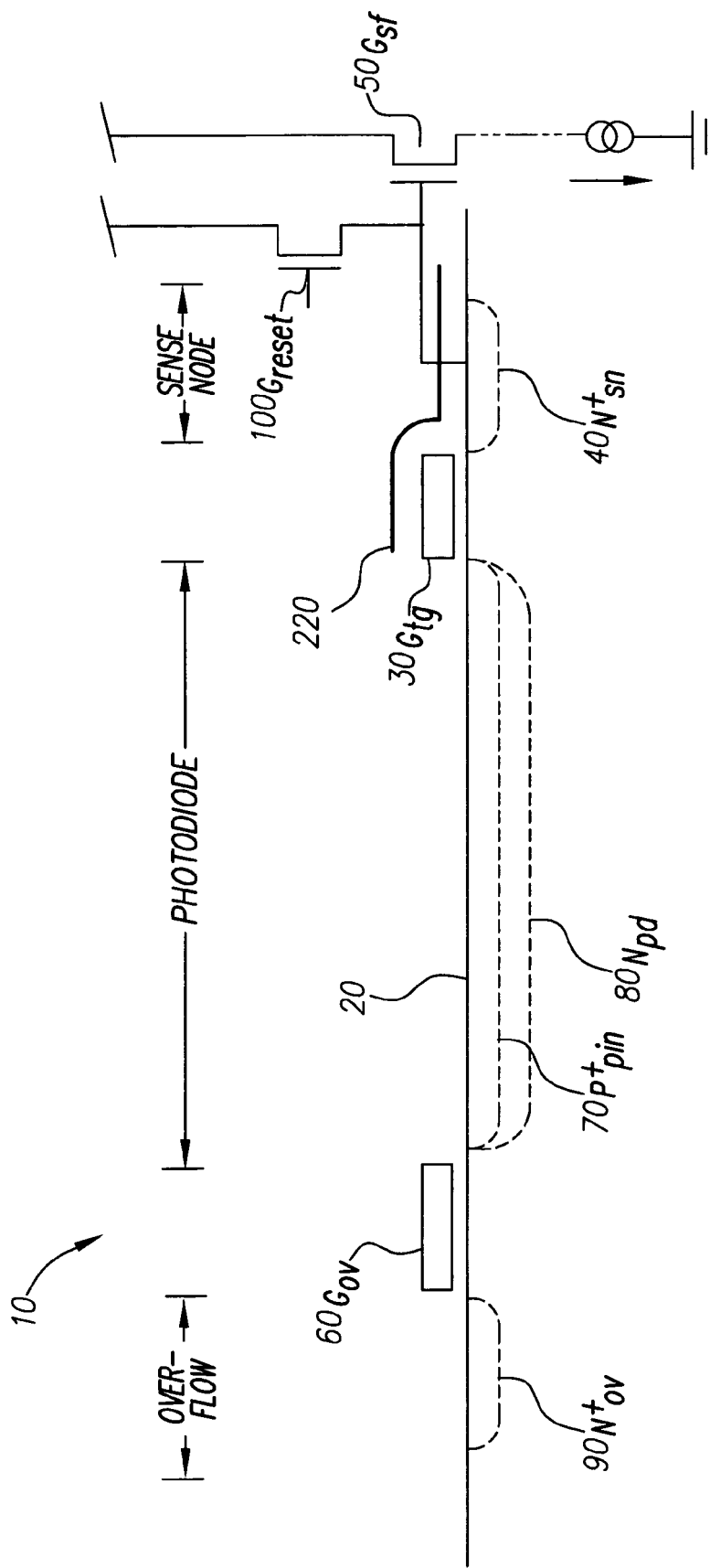
FIG. 1 is a side view of a prior art image sensor.
Figure 2:
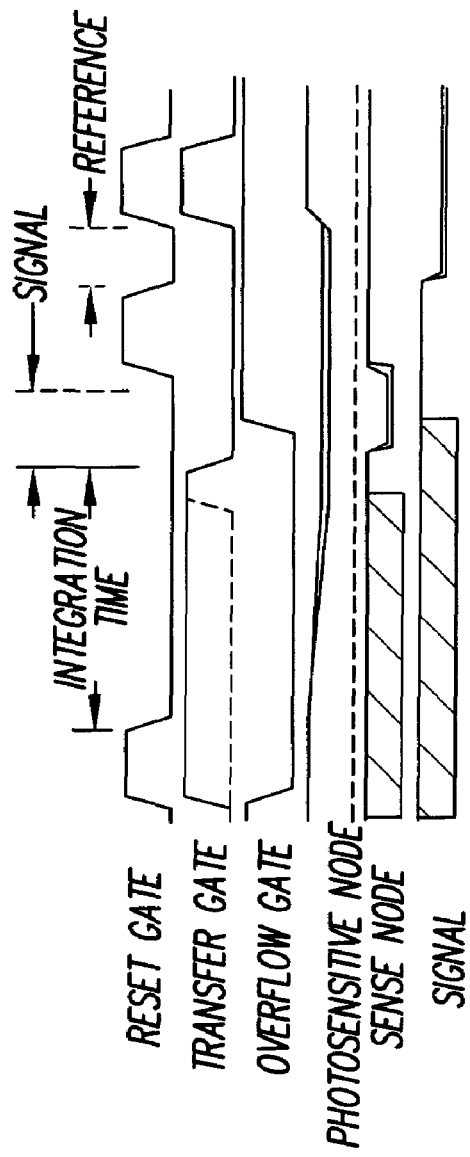
FIG. 2 is a timing diagram for FIG. 1.
Figure 5:
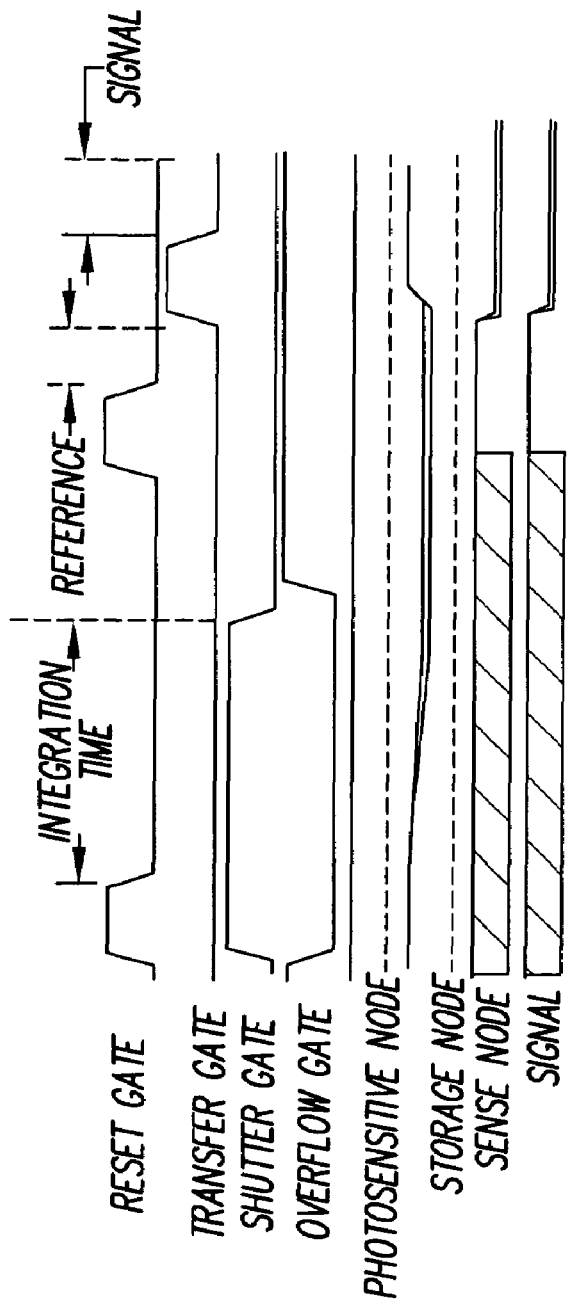
FIG. 5 is a timing diagram for FIG. 4.

Referring to FIGS. 4 and 5, operation involves using either the overflow gate 205 and overflow drain 210 or the shutter gate 160 and the transfer gate 180 and the reset gate 215 combination to empty the photodiode 130. The reset gate 215 also is used to reset the sense node 190 to a set bias greater than that of the photodiode 130 and, in combination with the shutter gate 160, to empty all charge from the second pinned diode or storage region 170. The shutter gate 160 is turned on and the overflow gate 205, the transfer gate 180 are then turned off on all pixels 120 simultaneously to begin the shutter window and the signal from the incident light generates charge on the photodiode 130 that is integrated on the storage region 170. To end the shutter window, the shutter gate 160 is turned off and the signal charge is held on the storage region 170. The overflow gate 205 is turned on so that any additional charge generated on the photodiode 130 will be drained away. The sense node 190 is reset to a reference voltage by clocking the reset transistor 215 on and off and the output is then readout. Then the transfer gate 180 is turned on so that the signal charge is transferred to the sense node 190 and the output is readout. The signal is the difference between the two readouts.

Figure 6:
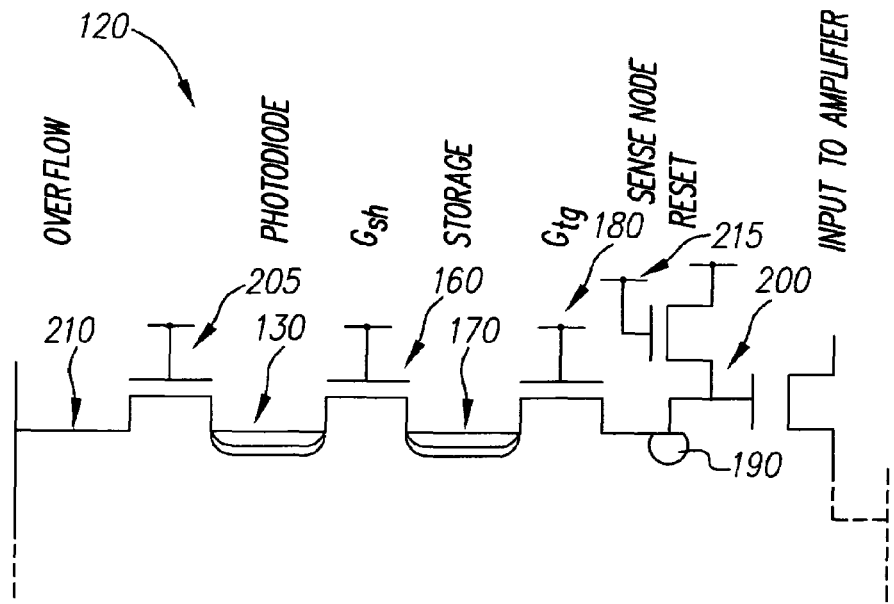
FIG. 6 is a side view in cross section of FIG. 4 illustrating an unshared configuration.
Figure 7:
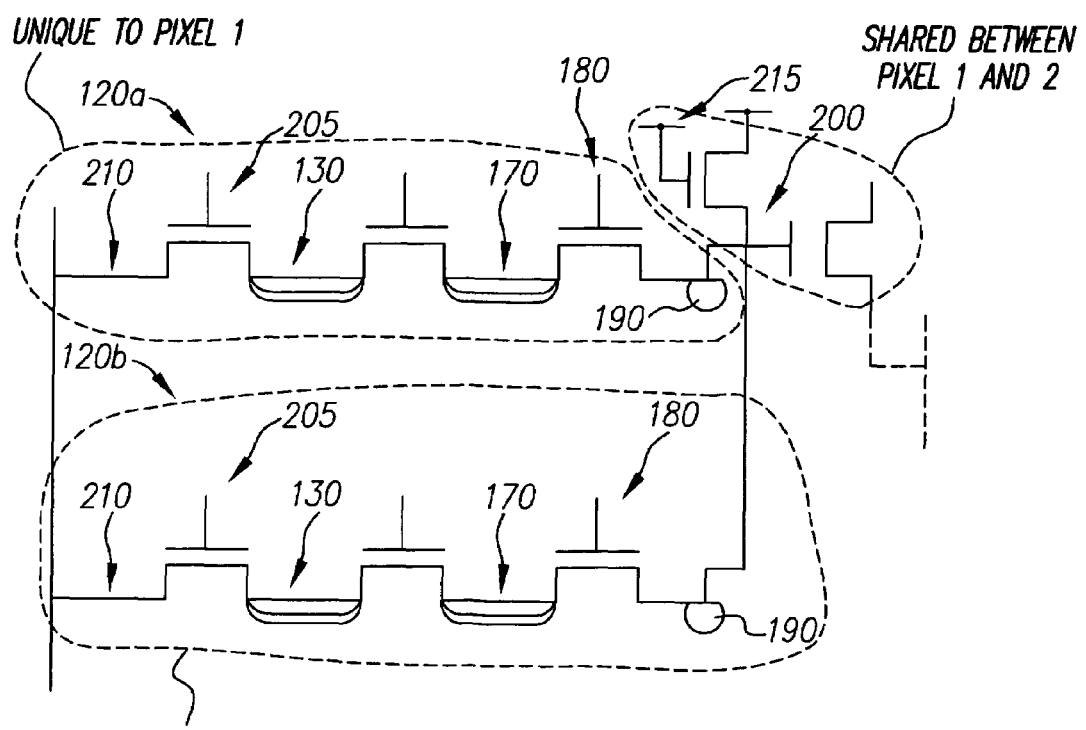
FIG. 7 is a side view in cross section of FIG. 4 illustrating a shared configuration.

FIG. 6 is a schematic diagram illustrating the invention of FIG. 4 in which all of the components (overflow drain 210, photodiode 130, shutter gate 160, second pinned diode 170, transfer gate 180, sense node 190, reset transistor 215, and amplifier 200) are within one pixel. FIG. 7 is schematic diagram illustrating the invention of FIG. 4 with the reset transistor 215 and amplifier in 200 physically shared between two pixels 120*a* and 120*b*. More specifically, FIG. 7 illustrates electrical sharing of the sense node 190, an amplifier input 200, and a reset transistor 215. It is noted that the sharing of FIG. 7 can be extended beyond two pixels as will be readily apparent to those skilled in the art.

Figure 8:
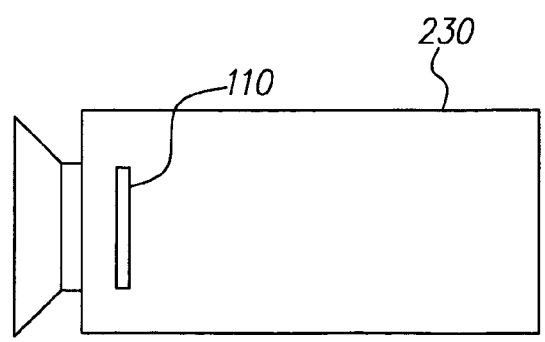
FIG. 8 is a side view of a digital camera having the image sensor of the present invention for illustrating a typical commercial embodiment to which the ordinary consumer is accustomed.

Referring to FIG. 8, there is shown a digital camera 230 for illustrating a typical commercial embodiment of the image sensor 110 of the present invention to which the ordinary consumer is accustomed.

The invention has been described with reference to a preferred embodiment. However, it will be appreciated that variations and modifications can be effected by a person of ordinary skill in the art without departing from the scope of the invention.

PARTS LIST

10 pixel
20 photodiode
30 transfer gate
40 sense node
50 source follower circuit
60 overflow gate
70 p-type pinning layer
80 n-type diffusion
90 overflow drain
100 reset gate
110 image sensor
115 readout circuitry
120 pixels
120*a* shared pixel 1
120*b* shared pixel 2
125 address circuitry
130 first pinned photodiode (photodetector)
140 layer
150 pinning layer
160 shutter gate
170 second pinned diode (storage region)
180 transfer gate
190 sense node (floating diffusion)
200 amplifier
205 overflow gate
210 overflow drain
215 reset transistor (gate)
220 lightshield
225 doped region or charge shield
230 digital camera

The invention claimed is:

1. An image sensor comprising:
   a two-dimensional array of pixels comprising:
   (a) a photodetector for collecting charge in response to incident light;
   (b) a storage region adjacent the photodetector that receives the charge from the photodetector; wherein the storage region is optimized for low dark current and low charge generation defects;
   (c) a sense node adjacent the storage region that receives the charge from the storage region and converts the charge to a voltage signal;
   (d) a doped region surrounding only the storage region and the sense node for substantially shielding the storage region and the sense node from photo-generated charge not transferred from the photodetector; and
   (e) an input to an amplifier for sensing the voltage signal from the sense node.

2. The image sensor as in claim 1, wherein each pixel comprises the photodetector and the storage region.

3. The image sensor as in claim 2, wherein the sense node and the input to the amplifier are shared by a subset of pixels.

4. The image sensor as in claim 1 wherein each pixel comprises the photodetector, storage region, sense node and the input to the amplifier.

5. The image sensor as in claim 1, wherein the storage region is a pinned photodiode.

6. The image sensor as in claim 1, wherein the photodetector is a pinned photodiode.

7. The image sensor as in claim 1 further comprising a lightshield spanning a substantial portion or all of the sense node.

8. The image sensor as in claim 7, wherein the lightshield is substantially 50 to 500 nanometers from a top surface of a semiconductor in the sense node.

9. The image sensor as in claim 7, wherein the lightshield spans both the sense node and a substantial portion or all of the storage region.

10. The image sensor as in claim 1 further comprising an overflow drain adjacent the photodetector.

11. A camera comprising:
   an image sensor comprising:
   a two-dimensional array of pixels comprising:
   (a) a photodetector for collecting charge in response to incident light;
   (b) a storage region adjacent the photodetector that receives the charge from the photodetector; wherein the storage region is optimized for low dark current and low charge generation defects;
   (c) a sense node adjacent the storage region that receives the charge from the storage region and converts the charge to a voltage signal;

(d) a doped region surrounding only the storage region and the sense node for substantially shielding the storage region and the sense node from photo-generated charge not transferred from the photodetector; and (e) an input to an amplifier for sensing the voltage signal from the sense node.

12. The camera as in claim 11, wherein each pixel comprises the photodetector and the storage region.

13. The camera as in claim 12, wherein the sense node and the input to the amplifier are shared by a subset of pixels.

14. The camera as in claim 11 wherein each pixel comprises the photodetector, storage region, sense node and the input to the amplifier.

15. The camera as in claim 11, wherein the storage region is a pinned photodiode.

16. The camera as in claim 11, wherein the photodetector is a pinned photodiode.

17. The camera as in claim 11 further comprising a lightshield spanning a substantial portion or all of the sense node.

18. The camera as in claim 17, wherein the lightshield is substantially 50 to 500 nanometers from a top surface of a semiconductor in the sense node.

19. The camera as in claim 17, wherein the lightshield spans both the sense node and a substantial portion or all of the storage region.

20. The camera as in claim 11 further comprising an overflow drain adjacent the photodetector.

* * * * *